United States Patent
Yeh et al.

(10) Patent No.: US 8,261,430 B2
(45) Date of Patent: Sep. 11, 2012

(54) METHOD FOR MANUFACTURING ANTI-ELECTROMAGNETIC INTERFERENCE SHIELDS

(75) Inventors: Chin-Wen Yeh, Taipei Hsien (TW); Zhi-Jian Peng, Shenzhen (CN)

(73) Assignees: Hong Fu Jin Precision Industry (ShenZhen)Co., Ltd., Shenzhen, Guangdong Province (CN); Hon Hai Precision Industry Co., Ltd., Tu-Cheng, New Taipei (TW)

(*) Notice: Subject to any disclaimer, the term of this patent is extended or adjusted under 35 U.S.C. 154(b) by 516 days.

(21) Appl. No.: 12/476,758

(22) Filed: Jun. 2, 2009

(65) Prior Publication Data

US 2010/0018045 A1    Jan. 28, 2010

(30) Foreign Application Priority Data

Jul. 23, 2008 (CN) .......................... 2008 1 0302944

(51) Int. Cl.
*G11B 5/127* (2006.01)
*H04R 31/00* (2006.01)

(52) U.S. Cl. .......... 29/603.03; 29/592.1; 29/602.1; 29/831; 29/844; 29/861; 156/268; 174/394; 361/800; 361/816; 361/818; 439/455; 439/458

(58) Field of Classification Search .......... 29/592.1, 29/602.1, 830, 831, 844, 861; 156/268, 344; 216/22, 39, 41, 48; 174/35 R, 35 GC, 35 MS, 174/394; 361/800, 816, 818; 439/455, 458, 439/609, 976

See application file for complete search history.

(56) References Cited

U.S. PATENT DOCUMENTS

| | | | |
|---|---|---|---|
| 5,405,197 A * | 4/1995 | Makowka | 383/5 |
| 5,411,784 A * | 5/1995 | Brewster | 428/131 |
| 5,557,064 A * | 9/1996 | Isern-Flecha et al. | 174/393 |
| 5,641,438 A * | 6/1997 | Bunyan et al. | 264/40.3 |
| 5,976,307 A * | 11/1999 | Cook, Jr. | 156/701 |
| 6,255,192 B1 * | 7/2001 | Dornisch | 438/430 |
| 6,436,246 B1 * | 8/2002 | Sandhu | 204/192.13 |
| 6,756,285 B1 * | 6/2004 | Moriceau et al. | 438/455 |
| 6,781,843 B2 * | 8/2004 | Liu et al. | 361/726 |
| 7,204,934 B1 * | 4/2007 | Braly et al. | 216/59 |

FOREIGN PATENT DOCUMENTS

JP        09099488 A *  4/1997

* cited by examiner

*Primary Examiner* — Paul D Kim
(74) *Attorney, Agent, or Firm* — Altis Law Group, Inc.

(57) ABSTRACT

A method for manufacturing anti-EMI shields on computer chassis, the method includes the following steps. The anti-EMI plate is glued to the computer chassis. The anti-EMI plate is pressed onto the plate by a pressing machine, and then the plate is quick dried with the anti-EMI plate by a drying machine. The plate is cut into desired dimension with the anti-EMI plate by a cutting machine, and the plate is stamped into desired shape with the anti-EMI plate by a stamping machine.

11 Claims, 2 Drawing Sheets

METHOD FOR MANUFACTURING ANTI-ELECTROMAGNETIC INTERFERENCE SHIELDS

BACKGROUND

1. Technical Field

The present disclosure relates to a manufacture method, particularly to a method for manufacturing anti-electromagnetic interference (anti-EMI) shields on computer chassis.

2. Description of Related Art

In observation of recent developments in the electronics industry, particularly the wide uses of various electronic products, unnecessary voltages or currents exist among various internal systems of the compact electronic product and produce many wide-frequency noises. Such noises seriously affect the functions of different parts. This phenomenon is normally called electromagnetic interference (EMI). EMI is a complicated problem in the computer manufacturing industry. The interference sources include the central processing unit (CPU), motors, inverters, relays, switches, transistors, amplifiers, power supplies or other exchange circuits.

To ensure operations of electronic products in normal EM environments, countries all over the world have started to implement EM controls, gauging the standards of many electronic, communication, scientific, industrial and medical instruments. Exported or local products have to pass tests in certified EM compatibility laboratories before they can be sold on the market. In general, the occurrence of EMI in electronic information products may result from bad internal circuit designs or shielding. To solve the problems caused by EMI according to the prior art, one can either improve the circuit or use EM wave shielding material shields to absorb or block EM waves. A typical method for manufacturing the anti-EMI shields on a computer chassis includes the steps of molding the plate of the computer chassis and the anti-EMI shields respectively, then mounting the anti-EMI shields onto the plate by riveting or screwing, which is very inconvenient and time-consuming in a factory assembly line.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
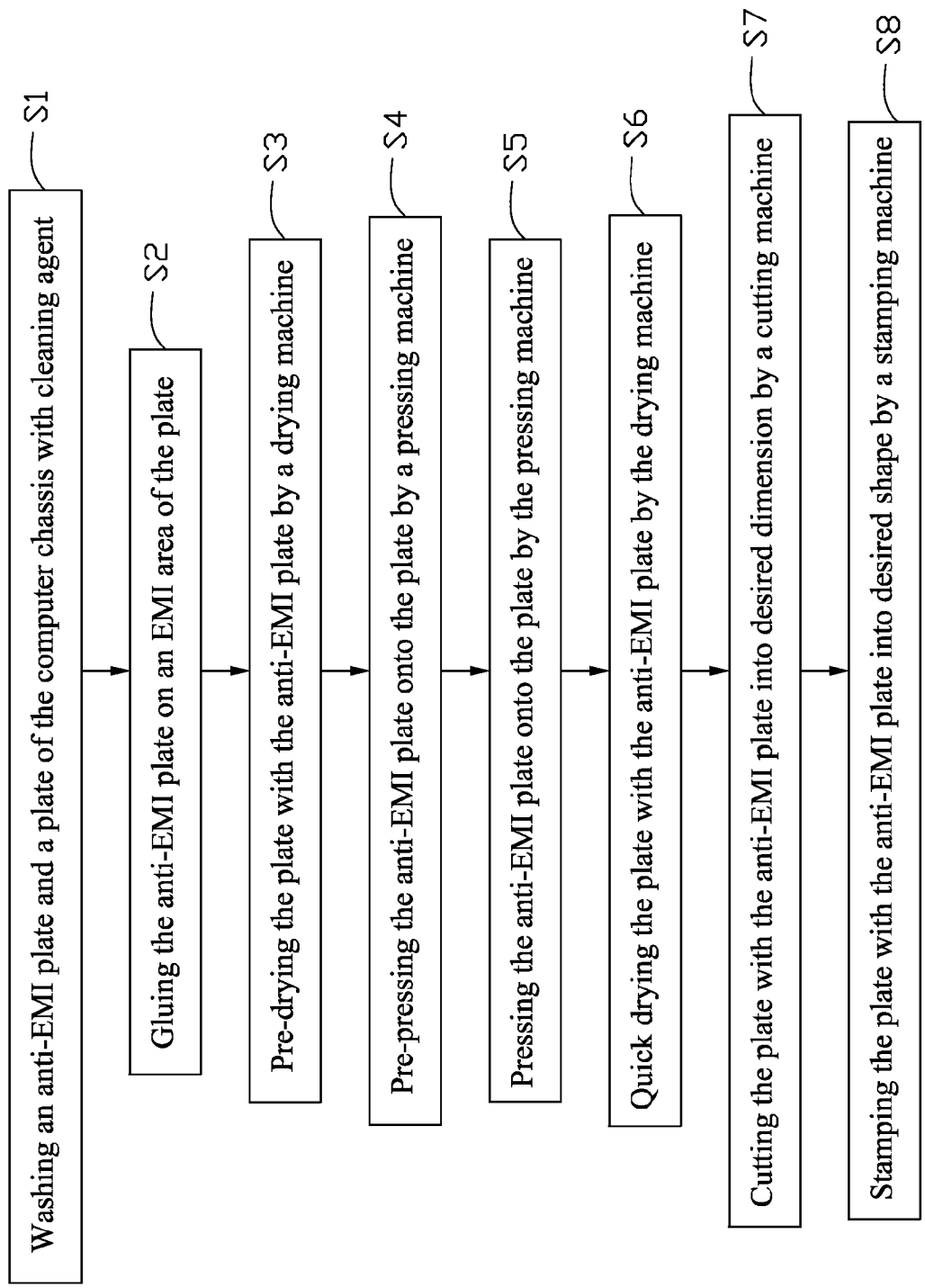
FIG. 1 is a flow chart of an embodiment of a method for manufacturing anti-EMI shields on computer chassis.

FIG. 1 is a flow chart of an embodiment of a method for manufacturing anti-EMI shields on computer chassis. The method for manufacturing anti-EMI shields includes the following steps:

In Step S1: washing an anti-EMI plate and a plate of the computer chassis with cleaning agent;

In Step S2: gluing the anti-EMI plate on an EMI area of the plate;

In Step S3: pre-drying the plate with the anti-EMI plate by a drying machine;

In Step S4: pre-pressing the anti-EMI plate onto the plate by a pressing machine;

In Step S5: pressing the anti-EMI plate onto the plate by the pressing machine;

In Step S6: quick drying the plate with the anti-EMI plate by the drying machine;

In Step S7: cutting the plate with the anti-EMI plate into desired dimension by a cutting machine;

In Step S8: stamping the plate with the anti-EMI plate into desired shape by a stamping machine.

In this embodiment, the drying machine is a belt-type automatic drying machine. The pressing machine is a dual roller-type pressing machine. The cutting machine is a cut-to-length type cutting machine. And the anti-EMI plate is made of elastic material. Pre-drying and quick drying the plate with the anti-EMI plate by the belt-type automatic drying machine can prevent the plate distorting during the stamping step. The anti-EMI shields are integrally formed with the plate of the computer chassis via gluing, pressing, drying, cutting and stamping steps in the present embodiment.

Figure 2:
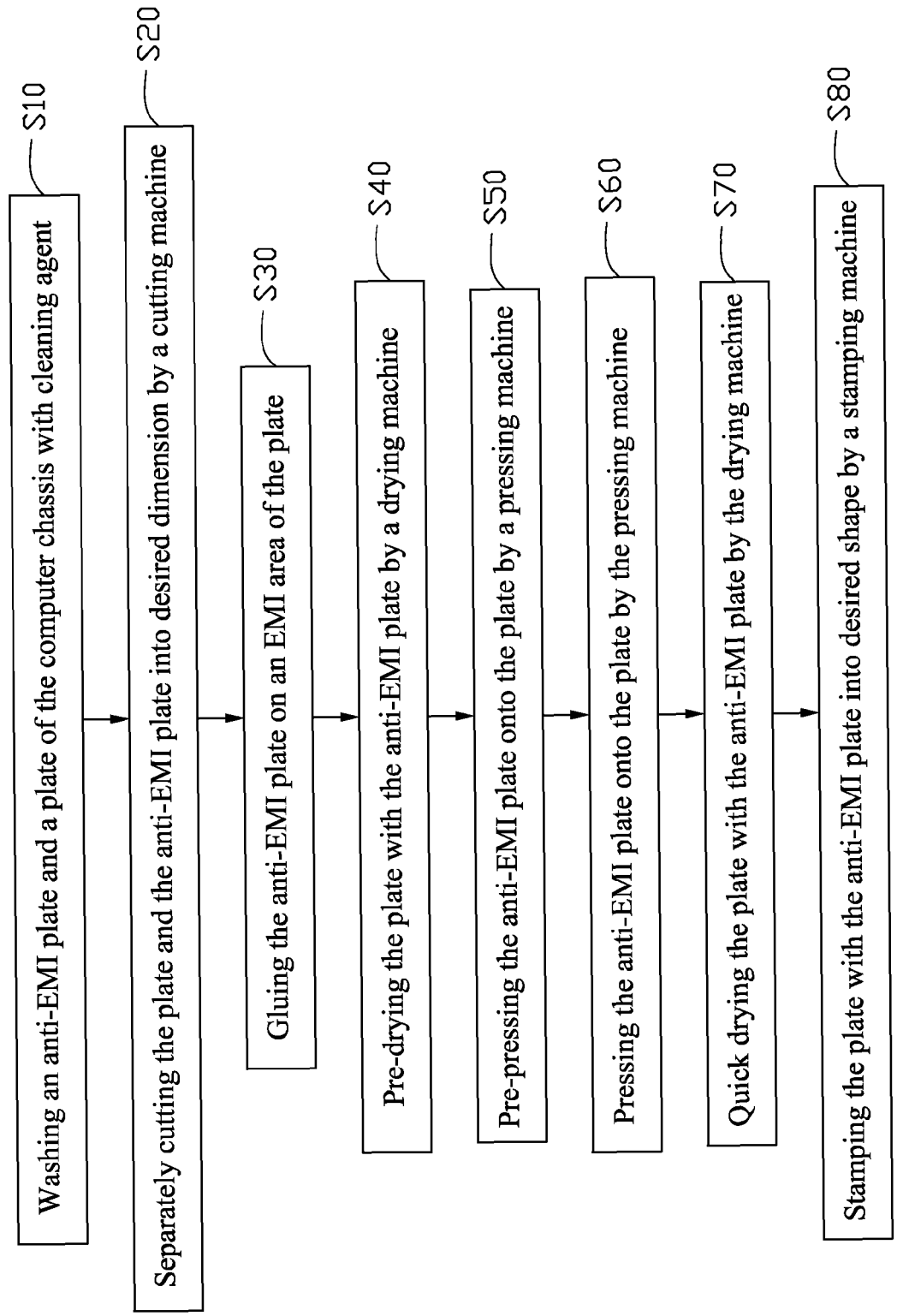
FIG. 2 is a flow chart of another embodiment of a method for manufacturing anti-EMI shields on computer chassis.

Referring to FIG. 2, in another embodiment, the method includes the following steps:

In Step S10: washing an anti-EMI plate and a plate of the computer chassis with cleaning agent;

In Step S20: separately cutting the plate and the anti-EMI plate into desired dimension by a cutting machine;

In Step S30: gluing the anti-EMI plate on an EMI area of the plate;

In Step S40: pre-drying the plate with the anti-EMI plate by a drying machine;

In Step S50: pre-pressing the anti-EMI plate onto the plate by a pressing machine;

In Step S60: pressing the anti-EMI plate onto the plate by the pressing machine;

In Step S70: quick drying the plate with the anti-EMI plate by the drying machine;

In Step S80: stamping the plate with the anti-EMI plate into desired shape by a stamping machine.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method for manufacturing anti-EMI shields on computer chassis, the method comprising:

washing the anti-EMI plate and the plate with cleaning agent;

gluing an anti-EMI plate on an EMI area of a plate;

pre-drying the plate with the anti-EMI plate by the drying machine and pre-pressing the anti-EMI plate onto the plate by the pressing machine;

pressing the anti-EMI plate onto the plate by a pressing machine;

quick drying the plate with the anti-EMI plate by a drying machine;

cutting the plate with the anti-EMI plate into desired dimension by a cutting machine; and stamping the plate with the anti-EMI plate into desired shape by a stamping machine.

2. The method of claim 1, wherein the drying machine is a belt-type automatic drying machine.

3. The method of claim 1, wherein the pressing machine is a dual roller-type pressing machine.

4. The method of claim 1, wherein the cutting machine is a cut-to-length type cutting machine.

5. The method of claim 1, wherein the anti-EMI plate is made of elastic material.

6. A method for manufacturing anti-EMI shields on computer chassis, the method comprising:

gluing an anti-EMI plate on an EMI area of a plate;

pre-drying the plate with the anti-EMI plate by a drying machine and pre-pressing the anti-EMI plate onto the plate by a pressing machine;

pressing the anti-EMI plate onto the plate by the pressing machine;

quick drying the plate with the anti-EMI plate by the drying machine;

cutting the plate with the anti-EMI plate into desired dimension by a cutting machine; and stamping the plate with the anti-EMI plate into desired shape by a stamping machine.

7. The method of claim 6, further comprising washing the anti-EMI plate and the plate with cleaning agent before gluing the anti-EMI plate on the EMI area of the plate.

8. The method of claim 6, wherein the drying machine is a belt-type automatic drying machine.

9. The method of claim 6, wherein the pressing machine is a dual roller-type pressing machine.

10. The method of claim 6, wherein the cutting machine is a cut-to-length type cutting machine.

11. The method of claim 6, wherein the anti-EMI plate is made of elastic material.

* * * * *